United States Patent [19]

Tomozawa et al.

[11] Patent Number: 4,782,037
[45] Date of Patent: Nov. 1, 1988

[54] PROCESS OF FABRICATING A SEMICONDUCTOR INSULATED CIRCUIT DEVICE HAVING A PHOSPHOSILICATE GLASS INSULATING FILM

[75] Inventors: Akihiro Tomozawa, Hinode; Yoku Kaino, Sayama; Shigeru Shimada, Houya; Nozomi Horino, Higashiyamato; Yoshiaki Yoshiura, Tanashi; Osamu Tsuchiya, Koganei; Shozo Hosoda, Tachikawa, all of Japan

[73] Assignees: Hatachi, Ltd; Hitachi Microcomputer Engineering Ltd., both of Tokyo, Japan

[21] Appl. No.: 925,458

[22] Filed: Oct. 30, 1986

Related U.S. Application Data

[63] Continuation of Ser. No. 640,516, Aug. 13, 1984, abandoned.

[30] Foreign Application Priority Data

Nov. 18, 1983 [JP] Japan .................. 58-216319
Nov. 18, 1983 [JP] Japan .................. 58-216320

[51] Int. Cl.$^4$ .................. H01L 21/441; H01L 21/473
[52] U.S. Cl. .................. 437/192; 437/56; 437/200; 437/240
[58] Field of Search .................. 357/59; 437/193, 200, 437/240, 52, 56

[56] References Cited

U.S. PATENT DOCUMENTS

| | | | |
|---|---|---|---|
| 3,833,919 | 9/1974 | Naber | 357/71 S |
| 4,091,406 | 5/1978 | Lewis | 357/54 |
| 4,091,407 | 5/1978 | Williams et al. | 357/54 |
| 4,097,889 | 6/1978 | Kern et al. | 357/54 |
| 4,180,596 | 12/1979 | Crowder et al. | 427/42 |
| 4,370,798 | 2/1983 | Lien et al. | 357/54 X |
| 4,378,628 | 4/1983 | Levinstein et al. | 29/571 |
| 4,392,150 | 5/1983 | Courreges | 357/67 S X |
| 4,420,344 | 12/1983 | Davis et al. | 29/571 |
| 4,476,482 | 10/1984 | Scott et al. | 357/71 |
| 4,581,815 | 4/1986 | Cheung et al. | 29/577 C |
| 4,640,004 | 2/1987 | Thomas et al. | 437/192 X |

FOREIGN PATENT DOCUMENTS

| | | | |
|---|---|---|---|
| 0246640 | 12/1985 | Japan | 148/DIG. 133 |
| 2087148 | 5/1982 | United Kingdom . | |
| 2092376 | 8/1982 | United Kingdom . | |
| 2107114 | 4/1983 | United Kingdom | 148/DIG. 147 |

OTHER PUBLICATIONS

Tanigaki et al., "A New Self-Aligned Contact Technology", J. Electrochem. Soc.: Solid-State Science and Technology, (1978), pp. 471–472.
Woo, D. S. et al., "Silicon Nitride Isolation of Phosphosilicate Glass Layer", in RCA Technical Notes, TN No. 1234, 11-1979.

Primary Examiner—Olik Chaudhuri
Attorney, Agent, or Firm—Antonelli, Terry & Wands

[57] ABSTRACT

Herein disclosed is a process of fabricating a semiconductor integrated circuit device, in which there is formed between a conductive layer prepared by covering a polycrystalline silicon layer with either a layer containing a refractory metal of high melting point, i.e., a refractory metal layer or a silicide layer of the refractory metal and a first insulating film made of phosphosilicate glass flowing over said conductive layer containing the refractory metal, a second insulating film preventing the layer containing a refractory metal from peeling from the polycrystalline silicon layer by the glass flow. The second insulating film is formed by deposition to have a thickness not smaller than a predetermined value.

49 Claims, 8 Drawing Sheets

PROCESS OF FABRICATING A SEMICONDUCTOR INSULATED CIRCUIT DEVICE HAVING A PHOSPHOSILICATE GLASS INSULATING FILM

This application is a continuation of application Ser. No. 640,516, filed Aug. 13, 1984, now abandoned.

BACKGROUND OF THE INVENTION

The present invention relates to a process of fabricating a semiconductor integrated circuit device and, more particularly, to a technique effective when applied to a semiconductor integrated circuit device which has a conductive layer prepared by covering a polycrystalline silicon layer with either a layer containing a refractory metal, i.e., a refractory metal layer or a silicide layer made of a compound of a refractory metal and silicon.

In order to realize a high-speed operation, one of the important subject matters of a folded bit line type DRAM (i.e., Dynamic Random Access Memory) is to reduce the resistance of a word line. It is, therefore, conceivable to use as the word line a conductive layer which is prepared by covering a polycrystalline silicon layer with a silicide layer composed of a refractory metal and silicon. The silicide layer is featured in that it has a lower resistance than the polycrystalline silicon layer and in that it is remarkably stable for the atmosphere at the various treating steps of the fabricating process like the polycrystalline silicon layer. This polycrystalline silicon layer bears abundant fruit when used in the semiconductor technique and has such a high reliability that a refractory metal in the silicide layer can be prevented from affecting the electrical characteristics of the semiconductor integrated circuit device.

In DRAM, a MISFET acting as a switching element of a memory cell frequently has its gate electrode integrated with the word line at an identical fabrication step. There is disclosed in Japanese Patent Laid-Open No. 57-194567 the concept that the polycrystalline silicon layer is formed beneath the silicide layer so that the threshold voltage of the MISFET may not fluctuate.

SUMMARY OF THE INVENTION

We, the Inventors, have discovered that the following problems arise in case a phosphosilicate glass film is used as an inter-layer insulating film between a word line, which is composed of a polycrystalline silicon layer and a molybdenum silicide ($MoSi_2$) layer, and a bit line, which is formed above the word line and which is made of aluminum, and in case the phosphorus concentration is increased to about 10 mol% to effect the well-known "glass flow" (refer to U.S. Pat. No. 3,825,442) so as to promote the flattening.

The molybdenum silicide layer to be overlaid on the polycrystalline silicon layer will peel from the polycrystalline silicon layer at the peripheral (or end) portions of the boundary with the polycrystalline silicon layer. This peeling phenomenon occurs not only in the word line but also in the peripheral circuit portion of the DRAM which is formed with a conductive layer consisting of the polycrystalline silicon layer and the molybdenum silicide layer. It is also confirmed by us that the molybdenum silicide layer not only peels partially but also is completely separated from the polycrystalline silicon layer.

We consider that the fact comes from the following causes.

The phosphosilicate glass film has a larger coefficient of thermal expansion than those of the polycrystalline silicon layer and the molybdenum silicide layer. Moreover, the adhesiveness between the molybdenum silicide layer and the phosphosilicate glass film is stronger than that between the polycrystalline silicon layer and the molybdenum silicide layer. After the phosphosilicate glass is subjected to the glass flow at about 1,000° C. for about 30 min., more specifically, an unnecessary stress for effecting the peel of the molybdenum silicide layer is generated as a result of elongation or contraction in the peripheral portion of the conductive layer.

An object of the present invention is to provide the technique for preventing the layer including a refractory metal from peeling off the semiconductor integrated circuit device, which is formed of a conductive layer of two-layered construction having a layer containing a refractory metal, i.e., a refractory metal layer or a silicide layer of the refractory metal, on a polycrystalline silicon layer, and an insulating film formed to cover the conductive layer by the glass flow and made of phosphosilicate glass.

Another object of the present invention is to provide the technique for improving the reliability of a semiconductor integrated circuit device.

A further object of the present invention is to provide the technique for speeding up the operation of the semiconductor integrated circuit device.

The above and other objects and novel features of the present invention will become apparent from the following description taken in conjunction with the accompanying drawings. A representative example of the inventions disclosed in this specification is described below briefly.

Between a conductive layer, which is prepared by covering a polycrystalline silicon layer with either a layer containing a refractory metal, i.e., a refractory metal layer or a silicide layer of the refractory metal, and a first insulating film which is formed to cover said conductive layer by the glass flow and which is made of a phosphosilicate glass, there is so formed a second insulating film, which reduces the unnecessary stress to effect the peel of the refractory metal layer or the silicide layer by the glass flow as to cover at least the conductive layer.

DESCRIPTION OF THE PREFERRED EMBODIMENT

The present embodiment will be described in case it is applied to the DRAM of folded bit line type.

A concrete construction will be first explained.

Figure 1A:
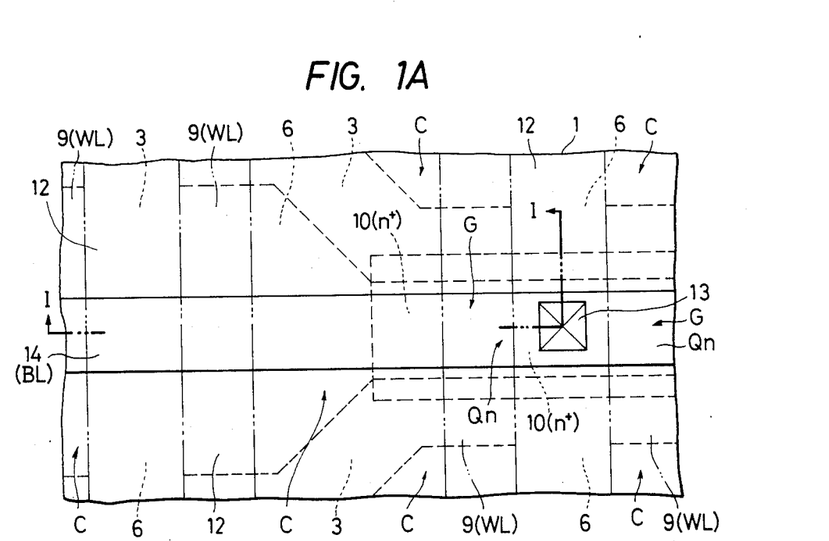
FIG. 1A is a top plan view showing an essential portion of the DRAM for explaining one embodiment of the present invention.
Figure 1B:
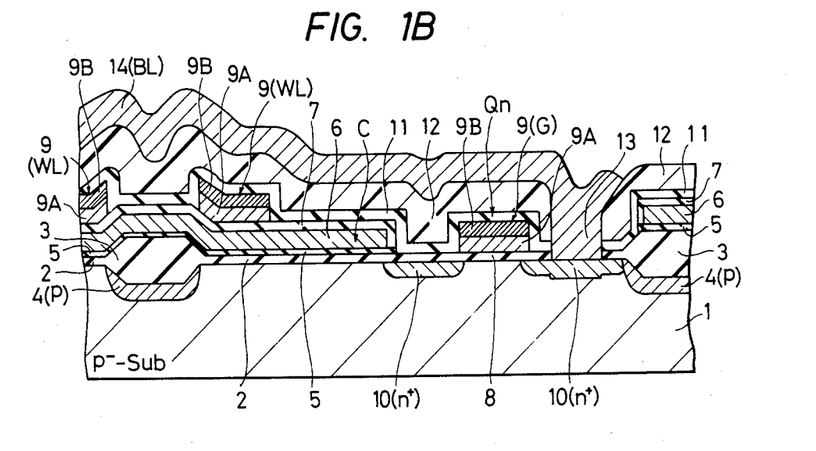
FIG. 1B is a section taken along line I—I of FIG. 1A.

FIG. 1A is a top plan view showing the essential portion of the DRAM and one memory cell for explaining one embodiment of the present invention, FIG. 1B is a section taken along line I—I of FIG. 1A.

Throughout the Figures, incidentally, parts having the same functions are indicated at identical reference characters, and their repeated explanations are omitted.

In FIGS. 1A and 1B, an insulating film 2, which is formed at such a region on a $p^-$-type semiconductor substrate ($p^-$-Sub) 1 made of single crystal of silicon as is to be formed with a memory cell, is formed to construct mainly a capacitor of the memory cell. The main surface of the semiconductor substrate 1 other than the region to be formed with the capacitor and the MISFET is occupied with a field insulating film 3 and a p-type channel stopper 4 underlying the field insulating film 3. These are formed to isolate the semiconductor elements more electrically. An insulating film 5 is formed above the insulating film 2 and the field insulating film 3 in the region to be formed with a capacitor electrode(conducting plate), as will be described hereinafter. The insulating film 5 constructs the capacitor. The insulating film 2 and the field insulating film 3 may be made of silicon dioxide films, for example, and the insulating film 5 may be made of a film having a higher dielectric constant than the insulating film 2, e.g., a silicon nitride film.

On the insulating film 5 other than the region to be formed with a MISFET acting as a switching element, there is formed a conducting plate 6 which is made of polycrystalline silicon. The capacitor C of the memory cell is constructed majorly of the semiconductor substrate 1, the insulating films 2 and 5 and the conducting plate 6. This conducting plate 6 is electrically isolated from a word line by an insulating film 7 which is formed to cover the conducting plate 6. An insulating film 8 is formed on such a region of the main surface of the semiconductor substrate 1 as to be formed with the MISFET and mainly constructs the gate insulating film of the MISFET.

Indicated at numeral 9 is a conductive layer which extends in the column direction on the insulating films 7 and 8 and which constructs a gate electrode at the region to be formed with the MISFET and a word line at the other regions. The conductive layer 9 is required to have a low resistance so that it may improve the turn-on and turn-off operation times of the MISFET to speed up the DRAM. Indicated at numeral 9A is a polycrystalline silicon layer which is formed on the insulating films 8 and 7. Indicated at numeral 9B is a layer which is formed to cover the polycrystalline silicon layer 9A and which is made of a composition of a refractory metal or molybdenum and silicon, such as molybdenum silicide ($MoSi_2$). The polycrystalline silicon layer 9A traps an impurity which is contained in a trace amount in the silicide layer 9B and which is not preferable for the electrical characteristics of the MISFET. The silicide layer 9B has a lower resistance than the polycrystalline silicon layer 9A and is highly stable like the polycrystalline silicon layer 9A for the atmospheres of the various treating steps of the fabrication process.

The silicide layer 9B may also be made of a compound of a refractory metal and silicon such as tantalum silicide ($TaSi_2$), tungsten silicide ($WSi_2$) or titanium silicide ($TiSi_2$). The silicide layer 9B may be a refractory metal layer having a lower resistance, such as molybdenum, tungsten, tantalum or titanium, too. In short, the silicide layer 9B has to be a layer containing a refractory metal. This refractory metal can cope with the heat treatment of the DRAM fabrication process.

An $n^+$-type semiconductor region 10, which is formed in the main surface of the semiconductor substrate 1 at both the sides of the conductive layer 9 to be formed with the MISFET, i.e., the gate electrode (G), is used as a source region or a drain region and constructs the MISFET acting as the switching element of the memory cell. The semiconductor region 10 at the side where the bit line is connected is likewise doped with the impurity, which is introduced into later-described phosphosilicate glass, so that its junction depth ($x_j$) from the surface of the semiconductor substrate 1 is made partially deep. This prevents the pn-junction of said semiconductor region 10 and the semiconductor substrate 1 from being broken when a voltage is applied to the semiconductor region 10.

The MISFET $Q_n$ acting as the switching element of the memory cell is constructed majorly of the gate electrode (G) of the conductive layer 9, the insulating film 8, and a pair of the semiconductor regions 10 formed at both the side portions of the gate electrode (G) in the main surface of the semiconductor substrate 1.

Indicated at numeral 11 is an insulating film which is formed on all the surface to cover the conductive layer 9. The insulating film 11 reduces the unnecessary stress, which is generated as a result of the glass flow of the phosphosilicate glass to cause the peel of the silicide layer 9B, thereby to prevent the separation of the silicide layer 9B from the polycrystalline silicon layer 9A.

In order to weaken the unnecessary stress which might otherwise cause the peel of the silicide layer 9B, a silicon dioxide ($SiO_2$) film prepared by the CVD (i.e., Chemical Vapour Deposition), for example, is used as the insulating film 11. As the insulating film 11, moreover, there may be used a silicon nitride film by the CVD, a silicon dioxide film and a silicon nitride film by the plasma CVD, and a phosphosilicate glass film which has such a low phosphor impurity concentration (e.g., 4 mol% or lower) as to cause no glass flow.

An inter-layer insulating film 12 is made of a phosphosilicate glass (PSG) film which is formed to cover all the surface of the conductive layer 9. This electrically isolates the conductive layer 9 and a later-described bit line and flattens the undulations caused by the multi-layered construction thereby to improve the coverage of the upper conductive layer. The insulating film 12 is subjected to the glass flow by setting the phosphor concentration at about 10 mol% so as to flatten the undulations resulting from the multi-layered construction. More specifically, the PSG film deposited has a generally uniform thickness all over the substrate. The PSG film is caused to flow when heated to about 1,000° C. The PSG film has its surface steps flattened and its corners made gentle in gradient. The insulating film 12 is elongated and contracted, respectively, when the glass is heated and cooled. The unnecessary stress to invite the peel of the silicide layer 9B is generated when the insulating film 12 is contracted. According to the present embodiment, however, the stress can be reduced to prevent the peel of the silicide 9B because the insulating film 11 is formed to cover the conductive layer 9.

A contact hole 13 is formed by selectively removing the insulating films 8, 11 and 12 lying over the semiconductor region 10 where the bit line is to be connected. A bit line (BL) 14 is formed such that it is electrically connected with the semiconductor region 10 through the predetermined contact hole 13 and such that it extends in the row direction over the insulating film 12. The bit line 14 may be made of an aluminum film, for example.

In order to achieve the purpose of preventing the peel, the insulating film 11 has to be a film which is formed not by the thermal oxidization but by the deposition.

Moreover, the insulating film 11 is required to have a thickness equal to or larger than a predetermined value. In this respect, the experimental results conducted by us and their considerations will be described in the following.

TABLE 1

| Films | Thickness | | | |
|---|---|---|---|---|
| | 0 Å | 1,000 Å | 1,500 Å | 3,500 Å |
| CVD High Temp. Low Press. | x | ○ | ○ | ○ |
| CVD Normal | x | Δ | ○ | ○ |

Table 1 tabulates the presence of the peels of the polycrystalline silicon layer 9A and the silicide layer 9B when the thickness (Å) of the insulating film 11 is varied. It should be noted here that the thickness values appearing in the Table are those in the state of FIG. 6, i.e., immediately after the insulating film is formed. This will be reasoned hereinafter. As the insulating film 11, there were used the SiO$_2$ film, which was formed by the CVD method at a high temperature (e.g., 700° to 800° C.) and under a low pressure (e.g., 0.1 to 10 Torr), and the SiO$_2$ film which was formed by the normal CVD method (at a temperature around 400° C. and under a pressure of 760 Torr).

In the Table, symbols x indicate that many peels were caused, and symbol ○ indicates no peel. In fact, the chip having experienced the peel for one wafer was zero or one and was limited to that in the peripheral portion of the wafer. Symbol Δ indicates that more or less peels were caused. The ratio of the chips in which the peels had taken place was about 2/17 to the total.

As is apparent from the description thus far made, many peels are caused when the insulating film 11 has a thickness of 0 Å, i.e., when the same is not present. The peeling phenomena can be substantially completely prevented when the insulating film 11 has a thickness equal to or larger than 1,500 Å.

TABLE 2

| Steps | Thickness | |
|---|---|---|
| | 0 Å | 3,500 Å |
| Formation of PSG Film | 42 to 49 μm | 50 to 52 μm |
| Glass Flow | 16 μm | 28 to 30 μm |

The strength of the stress causing those peels is tabulated in Table 2. This Table 2 indicates the stress, which is generated in the wafer in the state after the tabulated fabrication step, in terms of wafer warpage b (μm). The insulating film 11 in this case is the SiO$_2$ film which was formed by the high-temperature, low-pressure CVD method.

In the absence of the insulating film 11, the reduction (or change) in the wafer warpage as a result of the glass flow is high from 42 to 49 μm to 16 μm. In the presence of the insulating film 11 of 3,500 Å, the reduction (or change) in the wafer warpage as a result of the glass flow is low from 50 to 52 μm to 28 to 30 μm.

According to the considerations conducted by us, the peel is dependent not upon the wafer warpage itself but upon the change in the wafer warpage at each step. The peel is not caused for the small change but for the large change. The insulating film 11 softens the change in the warpage by the glass flow. In other words, the insulating film 11 softens the change in the stress. Thanks to the presence of the insulating film 11, however, the force by the glass flow when the stress changes is not applied to the interface between the polycrystalline silicon layer 9A and the silicide 9B.

Figure 10:
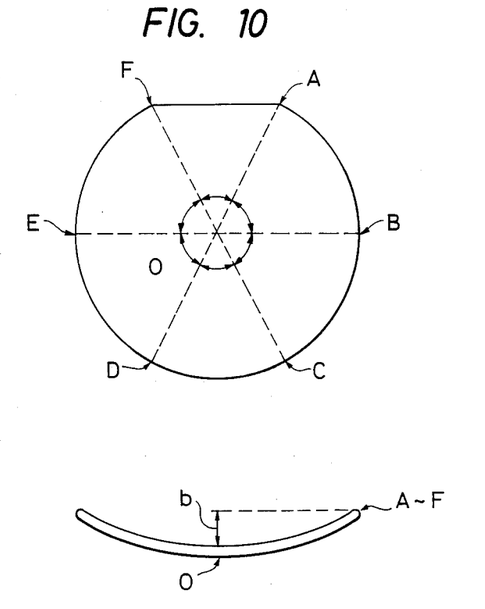
FIG. 10 is a diagram showing a method for measuring the warpage of a wafer.

Incidentally, the wafer warpage used is an average of the warpages at points A to F by the method shown in FIG. 10. We have also confirmed that the wafer warpage is changed at each step after the formation of the gate electrode 9 and before the formation of the insulating film 11. It is also conceivable that the changes of the wafer warpage among the individual steps have relation with the peel. However, it is also confirmed that the peel actually occurs only at the glass flow and can be prevented by the present invention.

According to the Table 1, the percentage of occurrence of the peels is different in dependence upon the film method when the insulating film 11 has a thickness of 1,000 Å. In this respect, the following facts are revealed by our investigations.

In case the SiO$_2$ film is used as the insulating film 11, phosphorus diffuses into the film from the PSG film 12. The diffusion rate of the phosphorus is different for the SiO$_2$ film by the high-temperature, low-pressure CVD method and for the SiO$_2$ film by the normal CVD method such that it is lower for the former. This is because the films have different densenesses. The SiO$_2$ film, in which phosphorus diffuses, has the same property as that of the PSG film. Since the insulating film 11 has a thickness as small as 1,000 Å, the pure SiO$_2$ film containing no phosphorus is not substantially present, and the phosphorus concentration thereabove (i.e., at the side of the PSG film 12) is considerably high near that of the PSG film 12. Moreover, it has been found that the upper portion of the insulating film having a predetermined or higher phosphorus concentration diffused is caused to reflow simultaneously with the glass flow. Incidentally, the concentration, of the phosphor diffused is dependent upon the phosphorus concentration of the PSG film 12 and upon the temperature and period of the glass flow. A fluidity is obtained when the phosphorus concentration reaches 4 mol% or higher.

Still moreover, the investigation results based upon the above fact have led to a discovery that no peel takes place if such a portion of the insulating film 11 as is left unreflown simultaneously with the glass flow has a predetermined thickness or more. This thickness may be about 600 Å. In order to ensure the thickness of about 600 Å at the portion left unreflown, it is necessary that the SiO$_2$ film by the high-temperature, low-pressure CVD method be as thick as 1,000 Å and that the SiO$_2$ film by the normal CVD method be rather thicker.

As a result, in case the insulating film 11 is made of such a silicon nitride film as is reluctant to be doped with phosphorus for effecting the glass flow of the phosphosilicate glass film, the unnecessary stress for peeling the silicide layer 9B can be sufficiently reduced if the insulating film 11 has a thickness of about 600 Å or larger while it is being formed. In case the insulating film 11 is made of such a silicon dioxide film as is liable to be doped with the impurity for effecting the glass flow, the portion for reducing the unnecessary stress has to be present to have a thickness of about 600 Å while considering the portion which is to be highly doped with the phosphorus until it reflows.

For this purpose, the insulating film 11 has to be controlled in its thickness at its forming step of the fabrication process. In case the insulating film 11 is the silicon nitride film, its thickness may be about 600 Å when it is formed. This value is more or less different in dependence upon the film forming method, as can be presumed from the Table 1. The foregoing description may be referred to in the case of the silicon dioxide film. In the case of the PSG film having a phosphorus concentration of about 1 mol%, the film thickness has to be made larger than the case of the silicon dioxide film. Thus, the peel can be prevented. In other words, the change in the stress having been described with reference to the Table 2 can be reduced.

Incidentally, a desired value is present for the total thickness of the insulating films 11 and 12, i.e., the thickness of the inter-layer insulating film. In order that the unnecessary impurity may be introduced into the insulating film 8 of the MISFET to affect its electrical characteristics, the thickness is desired to be larger for ensuring the sufficient electric isolation between the conductive layers by the phosphosilicate film. From the standpoint of feasibility in working the contact hole for connecting the bit line, on the contrary, the total thickness is desired to be smaller. In case the insulating film 11 is the SiO$_2$ film, the difference in the etching rate from the PSG film has to be taken into consideration. In order to flatten the PSG film by the glass flow, moreover, the PSG film should have a predetermined thickness or more. From the points described above, the thickness of the insulating film 11 is desired to be 4,000 Å or less. This value is preferred especially in the case of the SiO$_2$ film.

By taking the dispersion of the fabricating conditions, incidentally, the thickness of the insulating film 11 while being fored may be determined. In the case of the SiO$_2$ film, it is the most desireable that the film thickness during the formation be 1,500 to 3,500 Å.

A specific fabrication process will be explained in the following.

Figure 2A:
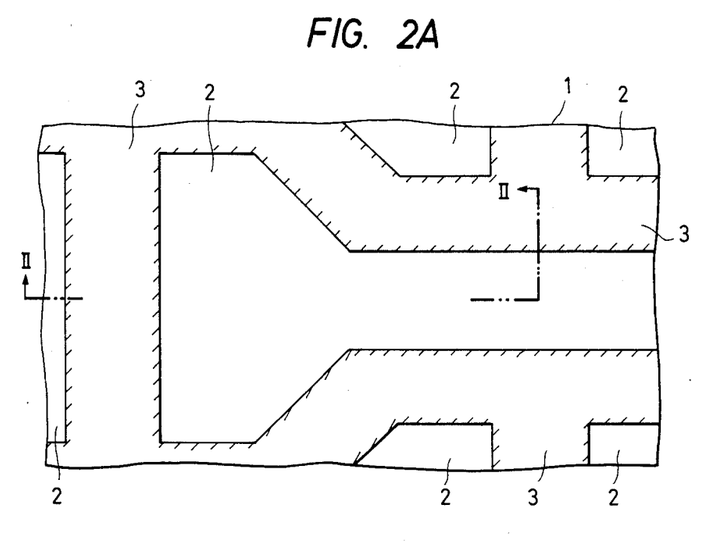
FIG. 2A, FIG. 3A, FIG. 4A, FIG. 5, FIG. 6 and FIG. 7A are top plan views and sections showing the essential portions of the DRAM at individual fabrication steps for explaining one embodiment of the present invention.
Figure 2B:
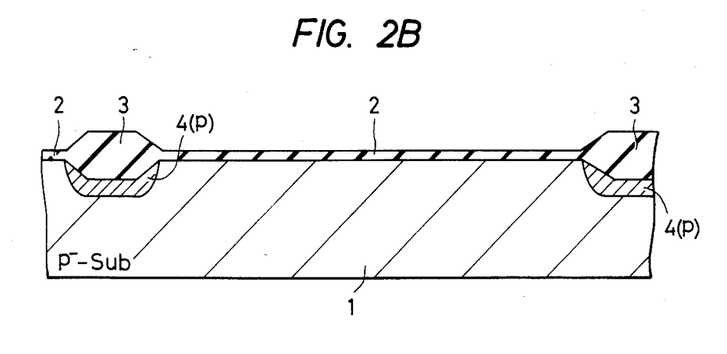
FIG. 2B is a section taken along line II—II of FIG. 2A.
Figure 3A:
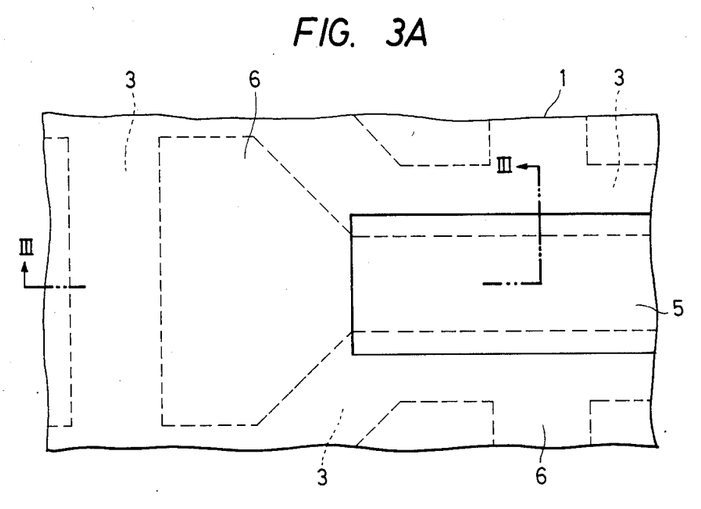
Figure 3B:
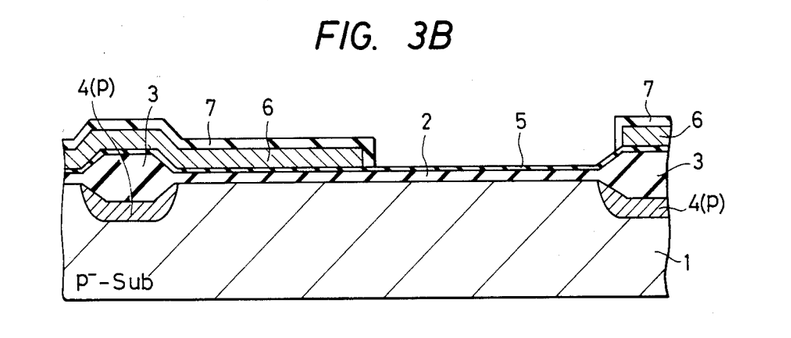
FIG. 3B is a section taken along line III—III of FIG. 3A.

FIG. 2A, FIG. 3A, FIG. 4A, FIG. 5, FIG. 6 and FIG. 7 are top plan views and sections of the essential portions of the DRAM showing one memory cell at the individual fabrication steps for explaining the embodiment of the present invention. FIG. 2B is a section taken along line II—II of FIG. 2A. FIG. 3B is a section taken along line III—III of FIG. 3A. FIG. 4B is a section taken along line IV—IV of FIG. 4A. FIG. 7B is a section taken along line VII—VII of FIG. 7A.

First of all, a p$^-$-type semiconductor substrate 1 of silicon single crystal is prepared. As shown in FIGS. 2A and 2B, moreover, a field insulating film 3 is formed on the main surface of the semiconductor substrate 1 between the regions to be formed with the semiconductor element, and a p-type channel stopper region 4 is formed simultaneously therewith on the main surface of the semiconductor substrate 1 below the field insulating film 3. On the surface of the substrate 1 other than the region formed with the field insulating film 3, there is formed an insulating film 2 which is prepared by the thermal oxidization technique of the surface, for example, as the SiO$_2$ film having a thickness of 300 to 500 Å. The field insulating film 3 may be made of a silicon dioxide film by the selective thermal oxidization technique of the well-known substrate 1, for example, to have a thickness of about 1 μm.

After the step shown in FIGS. 2A and 2B, the insulating film 2 and the field insulating film 3 are covered all over their surfaces with an insulating film 5. This insulating film 5 may be made of a silicon nitride film by the CVD technique, for example, to have a thickness of 100 to 200 Å. On the insulating film 5 made of the silicon nitride film, although not shown, there is formed a silicon dioxide film which has a thickness of about 30 to 50 Å, for example, so as to reduce the stress which is caused by the difference in the coefficients of thermal expansion between said insulating film 5 and a conducting plate to be formed at a later step. After this, the conducting plate 6 is selectively formed on the insulating film 5 other than the region which is to be formed with the MISFET acting as the switching element of the memory cell. That conducting plate 6 may be made of a polycrystalline silicon film which is prepared by the CVD technique, for example, to have a thickness of about 3,000 to 5,000 Å and which has its resistance lowered by introducing phosphorus. Moreover, the insulating film 5 exposed is used as a mask to thermally oxidize the polycrystalline silicon layer of the conducting plate 6 thereby to selectively form an insulating film (i.e., SiO$_2$) film 7 covering the conducting plate 6, as shown in FIGS. 3A and 3B. Incidentally, the insulating film to be formed between the individual conductive layers, i.e., the insulating film 7 is omitted from FIG. 3A and FIG. 4A so as to clarify the pattern of the conducting plate 6 and to facilitate its illustration.

Figure 4A:
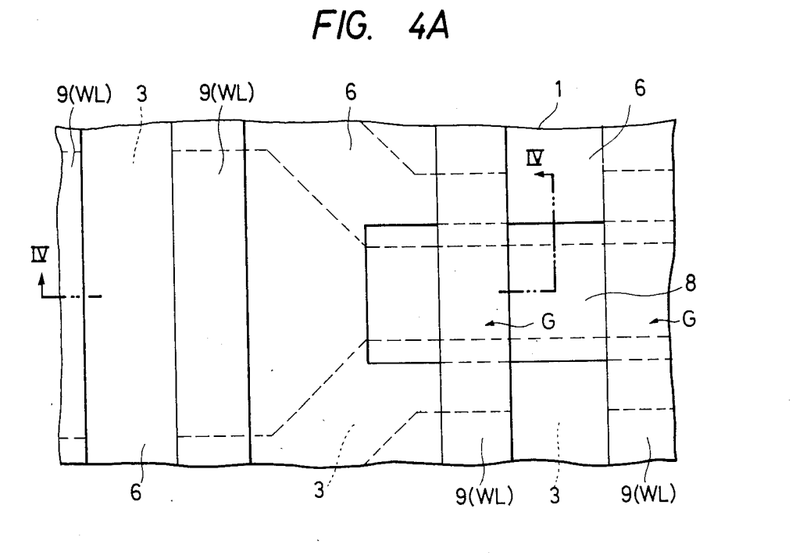
Figure 4B:
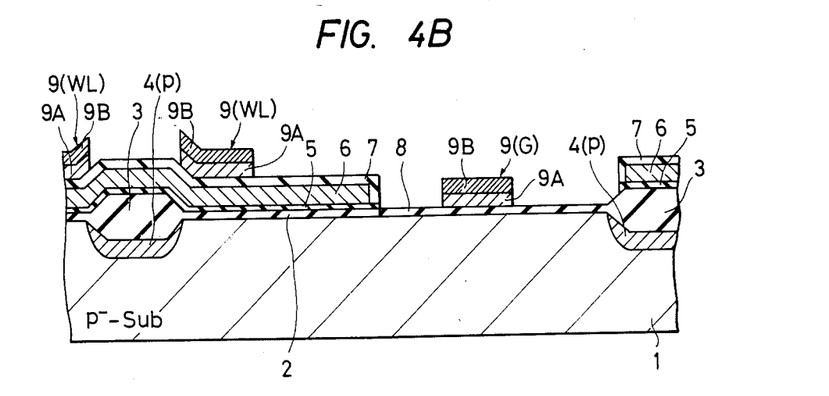
FIG. 4B is a section taken along line IV—IV of FIG. 4A.

After the step shown in FIGS. 3A and 3B, the insulating films 5 and 2 in the regions to be formed with the MISFET are selectively removed to expose the semiconductor substrate 1 to the outside. Then, an insulating film 8 is formed on the exposed main surface of the semiconductor substrate 1. The insulating film 8 may be made of a silicon dioxide film by the thermal oxidation of the substrate surface and may have a thickness of 500 to 600 Å so that the gate insulating film of the MISFET may be constructed. In order to form the word line and the gate electrode of the MISFET, moreover, the insulating film 7 and the insulating film 8 are covered all over their surfaces with a polycrystalline silicon layer 9A, which is covered all over its surface with a silicide layer 9B. The polycrystalline silicon layer 9A may be prepared by the CVD technique, for example, to have its resistance reduced by introducing phosphorus and to have a thickness of about 2,000 to 3,000 Å. On the other hand, the silicide layer 9B may be made of a molybdenum silicide film by the sputtering technique to have a thickness of about 2,500 to 3,500 Å. After that, the silicide layer 9B and the polycrystalline silicon layer 9A are selectively patterned to form the conductive layer 9 for providing a word line (WL) and a gate electrode (G)

of the MISFET, as shown in FIGS. 4A and 4B, and are then subjected to a heat treatment at about 1,000° C. in the atmosphere of an inert gas such as an argon gas. Incidentally, this heat treatment may be conducted before the patterning step for forming the conductive layer 9.

Figure 5:
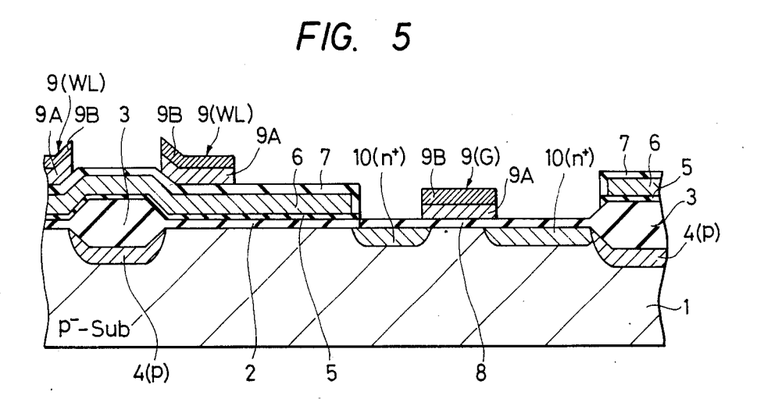

After the step shown in FIGS. 4A and 4B, as shown in FIG. 5, an n+-type semiconductor region 10 is formed in the main surface of the semiconductor substrate 1 through the insulating film 8 at both the sides of the conductive layer 9 (G) in the region to be formed with the MISFET. That semiconductor region 10 is formed using as a mask for doping the conductive layer 9 (G) and the insulating film 7 with an impurity and may be formed in self-alignment by the ion implantation technique, for example. In this case, energy at a level of about 70 to 90 KeV is used to introduce the impurity of arsenic (As) ions in a concentration of about $1.0 \times 10^{15}$ to $1.0 \times 10^{17}$ atms/cm$^2$.

Figure 6:
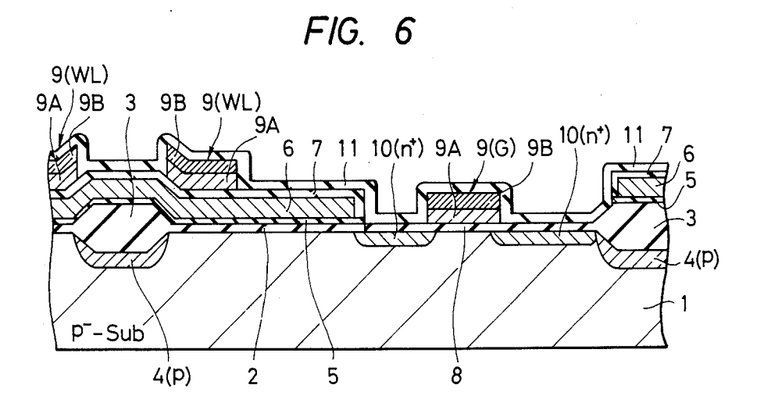

After the step shown in FIG. 5, an insulating film 11 covering the coonductive layer 9 is formed, as shown in FIG. 6, so as to reduce the unnecessry stress which is caused to effect the peel of the silicide layer 9B by the glass flow of the phosphosilicate glass film formed at the subsequent step. That insulating film 11 may be made of a silicon dioxide film which is prepared by the CVD method at a high temperature of about 700° to 800° C. and at a lower temperature of 0.1 to 10 Torr than the atmospheric level.

By the above reasoning, on the other hand, the insulating film 11 is required to have a thickness equal to or larger than 1,000 Å. In the present embodiment, the thickness of the insulating film 11 is desired to be about 1,000 to 4,000 Å and may preferably be 1,500 to 3,500 Å.

Figure 7A:
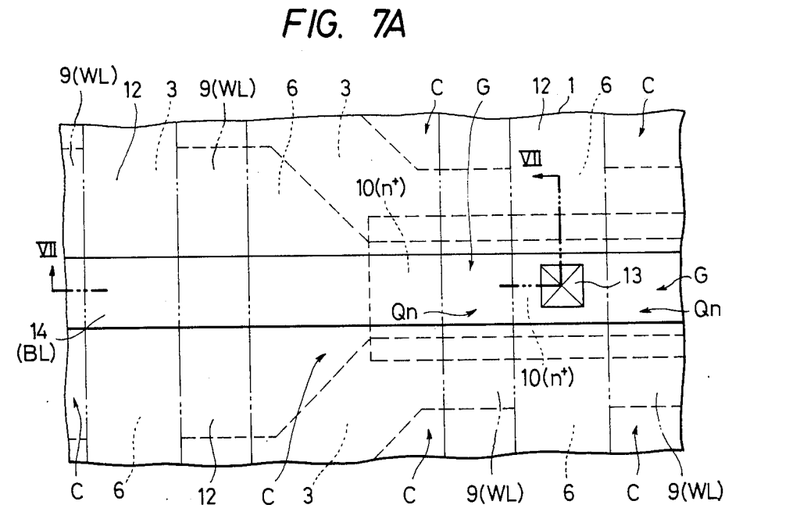
Figure 7B:
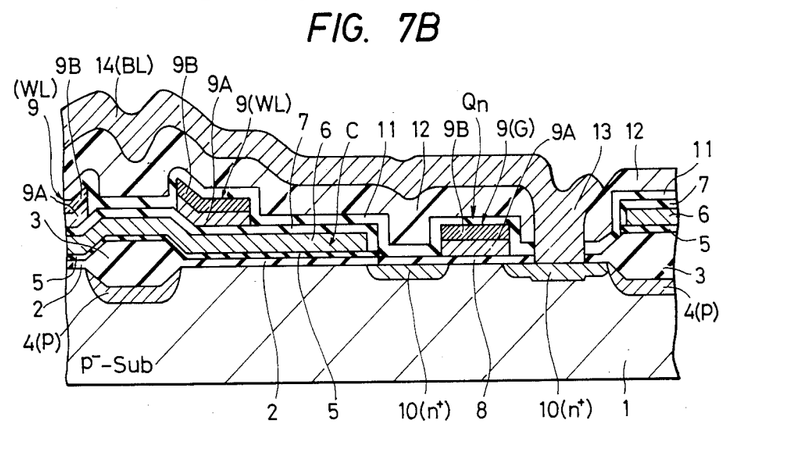
FIG. 7B is a section taken along line VII—VII of FIG. 7A.

After the step shown in FIG. 6, an insulating film 12 of phosphosilicate glass is formed. This insulating film 12 may have a phosphorus impurity concentration of about 10 mol%, for example, and a thickness of about 6,000 to 9,000 Å so as to ensure the glass flow. Moreover, the insulating films 8, 11 and 12 above the predetermined semiconductor region 10, which are to be connected with the bit line to be formed at a subsequent step, are selectively removed to form a contact hole 13. After that, in order to improve the coverage of the conductive layer formed on the insulating film 12, a glass flow of 30 min. at a temperature of about 1,000° C. is effected to flatten the undulations of the upper surface of the insulating film 12 thereby to promote the flattening. As shown in FIGS. 7A and 7B, moreover, a bit line 14 is selectively formed such that it is electrically connected with the semiconductor region 10 through the contact hole 13 and that it extends in the row direction on the insulating film 12. The bit line 14 may be made of an aluminum film, for example, to have the thickness of about 0.8 to 1.0 μm. Incidentally, the semiconductor region 10 is diffused upon introduction of the impurity and at the various subsequent heat treatment steps to have a predetermined depth ($x_j$). Moreover, the semiconductor region 10 connected with the bit line 14 is doped with the phosphorus impurity through the contact hole 13 during the glass flow so that it is made partially deeper than the other portions.

At the various heat treatment steps after the formation, the impurity for the glass flow of the insulating film 12 is introduced into the upper portion of the insulating film 11. Since it is considered that the glass flow is liable to take place at the doped portion, the result is that there is present the portion for preventing the peel of the silicide layer 9B. Upon completion of the DRAM, more specifically, the insulating film 11 for reducing the unnecessary stress for causing the peel of the silicide layer 9B as a result of the glass flow of the insulating flow 12 may have a thickness of about 600 Å or larger. After this, a protecting film is formed all over the surface.

In the present embodiment, the unnecessary stress of the insulating film 12 for causing the peel of the silicide layer 9B by the glass flow is reduced by the insulating film 11. Despite of this fact, an insulating film 12A made of phosphosilicate glass may be given both the function of the glass flow and a function to reduce the unnecessary stress.

Figure 8:
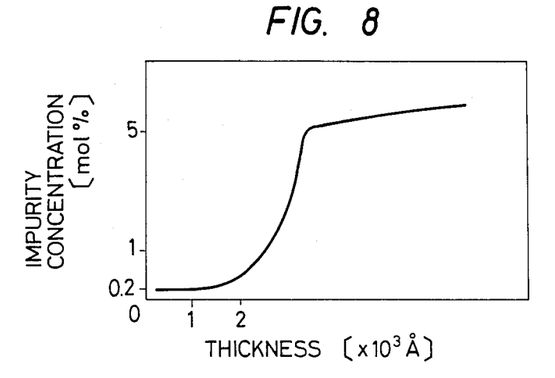
FIG. 8 is a graph showing the distribution of the phosphorus impurity concentration in an insulating film made of phosphosilicate glass for explaining one embodiment of the present invention.

FIG. 8 is a graph showing the distribution of the phosphor impurity concentration of the insulating film 12A made of phosphosilicate glass for explaining the embodiment of the present invention.

In FIG. 8, an abscissa indicates the thickness ($\times 10^3$ Å) of the insulating film (PSG) 12 from the boundary between the conductive layer 9 and the insulating film 12A, whereas an ordinate indicates the concentration mol% of the phosphorus impurity. In this case, the thickness of the insulating film 12A may be about 8,000 to 12,000 Å, for example.

As is apparent from the same Figure, the portion of the insulating film 12A covering and adjoining the conductive layer 9, i.e., the portion having a thickness equal to or smaller than 1,000 to 2,000 Å has a remarkably low phosphorus impurity concentration. The phosphor impurity concentration necessary for the insulating film 12A to effect the glass flow is equal to or higher than 4 mol%. Therefore, the phosphor impurity concentration of the insulating film 12A covering and adjoining the conductive layer 9 may be lower than those of the other portions, such as, than about 4 mol%. As a result, the unnecessary stress of the insulating film 12A, which is caused by the glass flow to peel the silicide layer 9B, can be reduced by the insulating film 12A in the vicinity of the conductive layer 9.

According to the specific forming method, the insulating film 12A is formed by forming the phosphosilicate glass film by the CVD technique in a manner to cover the conductive layer 9 and by introducing the phosphorus impurity into the phosphosilicate glass film from the surface into a predetermined depth so as to effect the glass flow. This formation does not lead to remarkable increase in the number of the steps of the fabricating process because it can be conducted in one furnace.

The description thus far made is directed mainly to the memory cell which constructs the memory cell array of the DRAM. A CMIS (i.e., Complementary MISFET) constructing the peripheral circuit of the DRAM will be described in the following.

Figure 9:
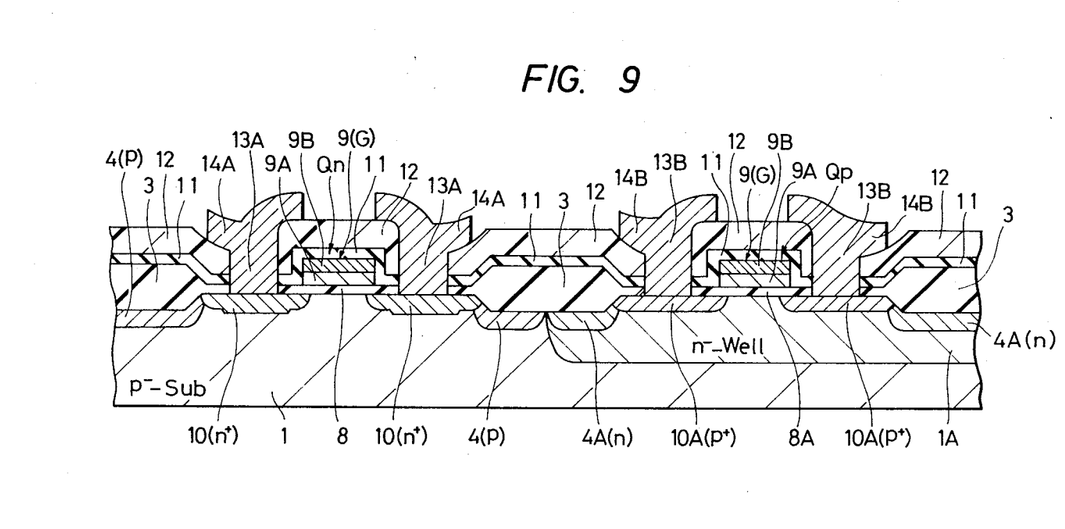
FIG. 9 is a section showing an essential portion of the peripheral circuit of the DRAM for explaining one embodiment of the present invention.

FIG. 9 is a sectional view showing the essential portion of the peripheral circuit of the DRAM for explaining a concrete construction of one embodiment of the present invention.

In FIG. 9, numeral 1A indicates an n⁻-type well region (N⁻-well) which is formed in a predetermined main surface of the semiconductor substrate 1 to construct a p-channel MISFET. Numeral 4A indicates an n-type channel stopper region formed under the field insulating film 3 in the well region 1A. Numeral 8A indicates an insulating film which is formed on the main surface of the well region 1A in the region to be formed with a semiconductor element such as the p-channel MISFET and which is used to construct the gate insulating film of the p-channel MISFET. Numeral 10A indicates a p+-type semiconductor region which is formed in the main surface of the well region 1A through the insulating film 8A at both the sides of the conductive layer 9 in the region to be formed with the p-channel MISFET and which is used to construct the p-channel MISFET. This p-channel MISFET $Q_P$ is constructed mainly of the gate electrode (G) by the conductive layer 9, the insulating film 8A, and a pair of the semiconductor regions 10A formed at both the side portions of the gate electrode (G) in the main surface of the well region 1A. The insulating film 11 is formed like the foregoing embodiment to cover the conductive layer 9 and to reduce the unnecessary stress of the insulating film 12 of phosphosilicate glass to cause the peel of the silicide layer 9B by the glass flow. Moreover, the insulating film 11 is formed to cover the semiconductor regions 10 and 10A simultaneously with the conductive layer 9. The insulating film acts to prevent the phosphorus impurity introduced into the insulating film 12 to effect the glass flow from being introduced unnecessarily into the semiconductor regions 10 and 10A through the insulating films 8 and 8A because the insulating films 8 and 8A of the MISFETs $Q_n$ $Q_p$ are remarkably thin, for example, about 500 to 600 Å. In other words, the insulating film 11 prevents the silicide layer 9B from being peeled and the unnecessary phosphorus impurity from being introduced at that time thereby to leave the MISFETs $Q_n$ and $Q_p$ unaffected in their electrical characteristics. The insulating film 11 is remarkably effective especially in the CMIS because the portion of the MISFET $Q_p$ in the vicinity of the surface of the semiconductor region 10A has its impurity concentration dropped to have an increased resistance so that the operating time is liable to be dropped. Numeral 13A is a contact hole which is formed by selectively removing the insulating films 8, 11 and 12 from above the predetermined semiconductor region 10 of the MISFET $Q_n$ and which is used to electrically connect the semiconductor region 10 and a later-described wire. Numeral 13B indicates a contact hole which is formed by selectively removing the insulating films 8A, 11 and 12 from above the predetermined semiconductor region 10A of the MISFET $Q_p$ and which is used to electrically connect the semiconductor region 10A and a later-described wire. Numeral 14A indicates a wire which is so formed on the insulating film 12 that it may be electrically connected with the semiconductor region 10 through the contact hole 13A. Numeral 14B is a wire which is so formed on the insulating film 12 that it may be electrically connected with the semiconductor region 10A through the contact hole 13B.

The following effects can be attained according to the present invention.

The second insulating film having the predetermined thickness is formed between the conductive layer and the first insulating film to cover at least the conductive layer. The unnecessary stress (or the change in the stress) of the first insulating film by the glass flow for causing the peel of the silicide layer is reduced by the second insulating film. As a result, it is possible to provide a highly reliable semiconductor integrated circuit device which is freed from any peel of the silicide layer.

The second insulating film having the predetermined thickness and a phosphorus impurity concentration at such a level as to effect no glass flow is formed in the vicinity of the first insulating film covering at least the conductive layer. The unnecessary stress (or the change in the stress) of the first insulating layer by the glass flow for causing the peel of the silicide layer is reduced by the second insulating film. Said unnecessary stress exerts no influence upon the conductive layer. As a result, it is possible to provide a highly reliable semiconductor integrated circuit device which is freed from any peel of the silicide layer.

As the conductive layer of the word line or the like, there can be used the conductive layer which is constructed of the polycrystalline silicon layer and either the refractory metal layer having a lower resistance or the silicide layer. As a result, the wiring resistance of the conductive layer, which cannot be made of aluminum or its alloy, can be reduced to provide a semiconductor integrated circuit device which can improve the operating time.

The second insulating film having the predetermined thickness and covering the gate electrode and the semiconductor region is formed between the gate electrode (i.e., the conductive layer) and the semiconductor region e.g., the source or drain region and the first insulating film. The unnecessary stress for causing the peel of the silicide layer of the first insulating film by the glass flow is reduced by the second insulating film so that it can be caused not to affect the gate electrode and so that the phosphorus impurity introduced into the first insulating film for effecting the glass flow can be prevented from being unnecessarily introduced into the semiconductor region. As a result, it is possible to provide a highly reliable semiconductor integrated circuit device which can prevent any peel of the silicide layer and which can stabilize the electrical characteristics of the MISFETs.

The present invention conceived by us has been specifically described hereinbefore in connection with the embodiments thereof. However, the present invention should not be limited to the foregoing embodiments but can naturally be modified in various manners within the scope of the gist thereof. The foregoing embodiments are directed to the case in which the present invention is applied to the DRAM, for example. However, the present invention can be applied to the semiconductor integrated circuit device such as a SRAM or a mask ROM, which is constructed of a conductive layer having a polycrystalline silicon layer and either a refractory metal layer or a silicide layer of the refractory metal, and an insulating film overlying the conductive layer and made of phosphosilicate glass for flattening the undulations.

The description thus far made is directed mainly to the case in which our invention is applied to the semiconductor integrated circuit device belonging to the field of application backing the invention, but the present invention should not be limited thereto. For example, the present invention can be applied to the multi-layered wiring technique of the wiring substrate.

What is claimed is:

1. A process of fabricating a semiconductor integrated circuit device, comprising:
   (a) the step of forming over a semiconductor substrate a first conductive layer which comprises a polycrystalline silicon layer and a layer of a silicide of a refractory metal formed on said polycrystalline silicon layer;
   (b) the step of forming a first insulating film, by chemical vapor deposition, covering said first conductive layer, said first insulating film having an initial thickness;

(c) the step of forming a second insulating film on said first insulating film;

(d) the step of heating said second insulating film so as to cause glass flow of said second insulating film, said first insulating film having such an initial thickness that, after said step of heating said second insulating film, the thickness of said first insulating film that has not been subjected to glass flow is at least 600 Å, whereby peeling of the layer of a silicide of a refractory metal from the polycrystalline silicon layer is substantially avoided; and (e) the step of forming a second conductive layer, which comprises an aluminum film, over the second insulating film.

2. A process according to claim 1, wherein said first insulating film has a thickness ranging from 600 Å to 4000 Å.

3. A process according to claim 2, wherein said first insulating film is a silicon dioxide film having a thickness equal to or larger than 1000 Å.

4. A process according to claim 2, wherein said first insulating film is a silicon nitride film having a thickness equal to or larger than 600 Å.

5. A process according to claim 2, wherein said first insulating film is a phosphosilicate glass film having a thickness ranging from 1000 Å to 2000 Å and having a phosphorus concentration equal to or lower than 4 mol %.

6. A process according to claim 1, wherein said second insulating film is a phosphosilicate glass film having a phosphorus concentration higher than 10 mol %.

7. A process according to claim 1, wherein said refractory metal is molybdenum.

8. A process according to claim 1, wherein said refractory metal is tungsten.

9. A process according to claim 1, wherein said refractory metal is tantalum.

10. A process according to claim 1, wherein said refractory metal is titanium.

11. A process according to claim 11, wherein said first insulating film is formed contiguous with said silicide layer.

12. A process according to claim 11, wherein said first conductive layer consists of said polycrystalline silicon layer and the silicide layer.

13. A process according to claim 12, wherein said second insulating film is a phosphosilicate glass film.

14. A process according to claim 13, wherein said phosphosilicate glass film is formed contiguous with said first insulating film.

15. A process according to claim 1, wherein said first conductive layer consists of said polycrystalline silicon layer and the silicide layer.

16. A process according to claim 1, wherein said second insulating film is a phosphosilicate glass film.

17. A process according to claim 16, wherein said first insulating film has such a thickness as to prevent the phosphorus in the phosphosilicate glass of the second insulating film from being diffused into the semiconductor substrate at a heating step performed after forming the second insulating film.

18. A process of fabricating a semiconductor integrated circuit device having an MISFET, comprising:

(a) the step of forming over a semiconductor substrate of first conductivity type a gate electrode which is comprised of a polycrystalline silicon layer and a layer formed on said polycrystalline silicon layer and containing a silicide of a refractory metal;

(b) the step of forming semiconductor regions of second conductivity type for providing source or drain regions in said semiconductor substrate at at least one side of said gate electrode;

(c) the step of forming a first insulating film, by chemical vapor deposition, covering said gate electrode and said semiconductor regions, said first insulating film having an initial thickness;

(d) the step of forming a second insulating film over said first insulating film;

(e) the step of heating said second insulating film so as to cause glass flow of the second insulating film, said first insulating film having such an initial thickness that, after said step of heating said second insulating film, the thickness of said first insulating film that has not been subjected to glass flow is at least 600 Å, whereby peeling of the layer containing a silicide of a refractory metal from the polycrystalline silicon layer is substantially avoided; and (f) the step of forming a conductive layer, which comprises an aluminum film, over the second insulating film.

19. A process according to claim 18, wherein said first insulating film has a thickness ranging from 600 Å to 4000 Å.

20. A process according to claim 19, wherein said first insulating film is a silicon dioxide film having a thickness equal to or larger than 1000 Å.

21. A process according to claim 19, wherein said first insulating film is a silicon nitride film having a thickness equal to or larger than 600 Å.

22. A process according to claim 19, wherein said first insulating film is a phosphosilicate glass film having a thickness ranging from 1000 Å to 2000 Å and having a phosphorus concentration equal to or lower than 4 mol %.

23. A process according to claim 18, wherein said second insulating film is a phosphosilicate glass film having a phosphorus concentration higher than 10 mol %.

24. A process according to claim 18, wherein said refractory metal is molybdenum.

25. A process according to claim 18, wherein said refractory metal is tungsten.

26. A process according to claim 18, wherein said refractory metal is tantalum.

27. A process according to claim 18, wherein said refractory metal is titanium.

28. A process of fabricating a complementary MIS integrated circuit, comprising:

(a) the step of preparing a first semiconductor region of first conductive type and a second semiconductor region of second conductive type from a semiconductor substrate, the first and second conductivity types being of opposite conductivity;

(b) the step of forming gate electrodes over said first semiconductor region and said second semiconductor region, respectively, the gate electrodes being comprised of a polycrystalline silicon layer and a layer formed on said polycrystalline silicon layer and containing a silicide of a refractory metal;

(c) the step of forming source and drain regions in both said first semiconductor region and in said second semiconductor region, respectively, at the sides of the respective gate electrodes, the source and drain regions being of conductivity type opposite that of said first semiconductor region and said second semiconductor region, respectively;

(d) the step of forming a first insulating film, by chemical vapor deposition, covering said gate electrodes and said source and drain regions, said first insulating film having an initial thickness;

(e) the step of forming a second insulating film on said first insulating film;

(f) the step of heating said second insulating film so as to cause glass flow of the second insulating film, said first insulating film having such an initial thickness that, after said step of heating said second insulating film, the thickness of said first insulating film that has not been subjected to glass flow is at least 600 Å, whereby peeling of the layer containing a silicide of a refractory metal from the polycrystalline silicon layer is substantially avoided; and (g) the step of forming a conductive layer, which comprising an aluminum film, over the second insulating film.

29. A process according to claim 28, wherein said first insulating film has a thickness ranging from 600 Å to 4000 Å.

30. A process according to claim 29, wherein said first insulating film is a silicon dioxide film having thickness equal to or larger than 1000 Å.

31. A process according to claim 29, wherein said first insulating film is a silicon nitride film having a thickness equal to or larger than 600 Å.

32. A process according to claim 29, wherein said first insulating film is a phosphosilicate glass film having a thickness ranging from 1000 Å to 2000 Å and having a phosphorus concentration equal to or lower than 4 mol %.

33. A process according to claim 28, wherein said second insulating film is a phosphosilicate glass film having a phosphorus concentraton higher than 10 mol %.

34. A process according to claim 28, wherein said refractory metal is molybdenum.

35. A process according to claim 28, wherein said refractory metal is tungsten.

36. A process according to claim 28, wherein said refractory metal is tantalum.

37. A process according to claim 28, wherein said refractory metal is titanium.

38. A process of fabricating a semiconductor integrated circuit device in a semiconductor substrate, the integrated circuit device having a plurality of memory cells, each memory cell including a capacitor and a MISFET connected to the capacitor in series, comprising:

(a) the step of forming a capacitor electrode of polycrystalline silicon over a surface of the semiconductor substrate;

(b) the step of forming a gate electrode of said MISFET, said gate electrode comprising a polycrystalline silicon layer and a layer formed on said polycrystalline silicon layer and containing a silicide of a refractory metal;

(c) the step of forming a first insulating film, by chemical vapor deposition, covering said capacitor electrode and said gate electrode, said first insulating film having an initial thickness;

(d) the step of forming a second insulating film on said first insulating film;

(e) the step of heating said second insulating film so as to cause glass flow of the second insulating film, said first insulating film having such an initial thickness that, after said step of heating said second insulating film, the thickness of said first insulating film that has not been subjected to glass flow is at least 600 Å, whereby peeling of the layer containing a silicide of a refractory metal from the polycrystalline silicon layer is substantially avoided; and (f) the step of forming a first conductive layer, which comprises an aluminum film, over the second insulating film.

39. A process according to claim 38, wherein said first insulating film has a thickness ranging from 600 Å to 4000 Å.

40. A process according to claim 39, wherein said first insulating film is a silicon dioxide film having a thickness equal to or larger than 1000 Å.

41. A process according to claim 39, wherein said first insulating film is a silicon nitride film having a thickness equal to or larger than 600 Å.

42. A process according to claim 39, wherein said first insulating film is a phosphosilicate glass film having a thickness ranging from 1000 Å to 2000 Å and having a phosphorus concentration equal to or lower than 4 mol %.

43. A process according to claim 38, wherein said second insulating film is a phosphosilicate glass film having a phosphorus concentration higher than 10 mol %.

44. A process according to claim 38, wherein said refractory metal is molybdenum.

45. A process according to claim 38, wherein said refractory metal is tungsten.

46. A process according to claim 38, wherein said refractory metal is tantalum.

47. A process according to claim 38, wherein said refractory metal is titanium.

48. A process of fabricating a semiconductor integrated circuit device having a phosphosilicate glass layer, which has been subjected to glass flow, over a first conductive layer comprised of (1) a polycrystalline silicon layer formed on a semiconductor substrate and (2) a layer of a silicide of a refractory metal formed on the polycrystalline silicon layer, so as to avoid peeling of the silicide layer from the polycrystalline silicon layer, comprising:

(a) the step of forming a first insulating film by depositing said first insulating film on said first conductive layer, said first insulating film having an initial thickness;

(b) the step of forming said phosphosilicate glass layer on said first insulating film; and (c) the step of heating said phosphosilicate glass layer so as to cause glass flow of said phosphosilicate glass layer, said first insulating film having such an initial thickness that, after the step of heating the phosphosilicate glass layer to cause glass flow thereof, the thickness of said first insulating film that has not been subjected to glass flow is at least 600 Å, whereby a stress on the silicide layer resulting from the glass flow is sufficiently reduced such that resultant peeling of the silicide layer from the polycrystalline silicon layer is substantially avoided.

49. A process according to claim 48, wherein the first insulating film is formed contiguous with the silicide layer, and the phosphosilicate glass layer is formed contiguous with the first insulating film.

* * * * *